US007012843B2

(12) United States Patent
Schroegmeier et al.

(10) Patent No.: US 7,012,843 B2
(45) Date of Patent: Mar. 14, 2006

(54) DEVICE FOR DRIVING A MEMORY CELL OF A MEMORY MODULE BY MEANS OF A CHARGE STORE

(75) Inventors: Peter Schroegmeier, Munich (DE); Thilo Marx, Villingen-Schwenningen (DE); Manfred Dobler, Ergoldsbach (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/180,818

(22) Filed: Jun. 26, 2002

(65) Prior Publication Data

US 2003/0002354 A1    Jan. 2, 2003

(30) Foreign Application Priority Data

Jun. 27, 2001    (DE) ................................ 101 31 007

(51) Int. Cl.
*G11C 7/00*    (2006.01)
(52) U.S. Cl. ................. 365/189.11; 365/149; 365/233; 327/390
(58) Field of Classification Search ........... 365/189.11, 365/149, 233; 327/390
See application file for complete search history.

(56) References Cited

U.S. PATENT DOCUMENTS 6,396,324 B1 *  5/2002  Hsu et al. .................. 327/298
6,519,191 B1 *  2/2003  Morishita .............. 365/189.09
6,584,032 B1 *  6/2003  Fujioka et al. ............. 365/227

* cited by examiner

*Primary Examiner*—Hoai Ho
(74) *Attorney, Agent, or Firm*—Jenkins, Wilson & Taylor, P.A.

(57) ABSTRACT

A device for driving a memory cell (601) of a memory module which can be operated with an external voltage ($V_{EXT}$) and an operating frequency ($f_{CLK}$), whereas the memory cell (601) has a capacitance (600) for storing charges and a transistor (602) for reading charges from the capacitance (600) and for writing charges to the capacitance (600), which transistor can be controlled with a control voltage ($V_{PP}$), which has a charge store (614) for supplying a control voltage ($V_{PP}$) which is greater than the external voltage ($V_{EXT}$). The charge store (614) being able to be charged by the external voltage ($V_{EXT}$), and the charging of the charge store (614) is able to be controlled by a charging control frequency ($f_{CC}$) derived from the operating frequency ($f_{CLK}$) of the memory module.

8 Claims, 5 Drawing Sheets

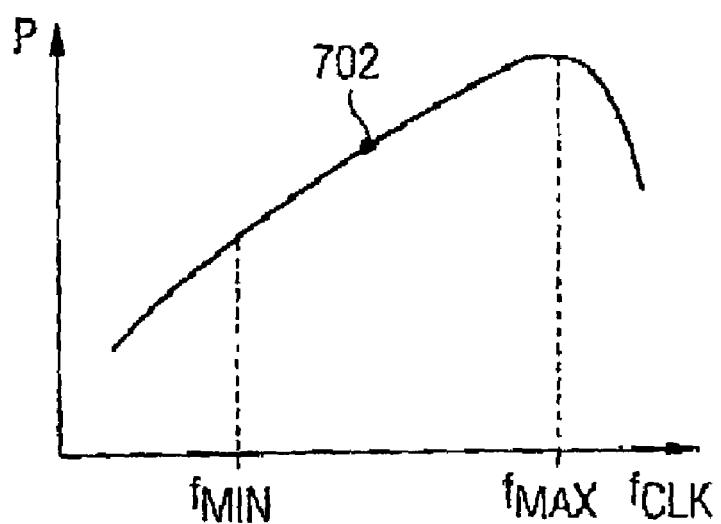

DEVICE FOR DRIVING A MEMORY CELL OF A MEMORY MODULE BY MEANS OF A CHARGE STORE

TECHNICAL FIELD

The present invention relates to a device for driving a memory cell and in particular to a device for driving a memory cell of a memory module.

BACKGROUND ART

FIG. 1 shows a typical memory cell which is used for example in a dynamic random access memory (DRAM). The memory cell has a capacitance 100 or a cell capacitance for storing charges, in which information items can be stored, and a transistor 102, which preferably has a field-effect transistor, for driving the capacitance 100. The transistor 102 is also referred to as selection transistor or cell transistor and is used for reading charges into the capacitance 100 and for reading charges from the capacitance 100. During a process of writing charges to the capacitance 100 or a write operation the transistor 102 is opened with the aid of a control voltage $V_{PP}$ at a control input 104 of said transistor, e.g. at the gate of the field-effect transistor, and a logic low level or a local 0 or a logic high level or a logic 1 is written to the capacitance 100. Afterward, the transistor 102 is closed, and the information is stored. In order to read out the information, the transistor 102 is opened again, and the stored charge can be evaluated. In order to amplify the very small charge or voltage stored in the capacitance 100, a differential amplifier 106 is furthermore provided outside the memory cell, which amplifier compares the voltage across the capacitance 100 with a reference voltage $V_{REF}$ and amplifies it.

The transistors used in memory cells are usually NPN field-effect transistors, which are turned on in the event of a logic high level of a respective control voltage $V_{PP}$, present at the control input or the gate terminal of the transistor. Since the charge to be read out in the capacitance of the memory cell only leads to very small voltage differences of typically 10–30 mV at the differential amplifier, the control voltage $V_{PP}$ at the control input of the transistor is raised by means of the normal internal voltage $V_{INT}$ of the memory cell or of the memory module having the memory cell. This measure leads to a very small resistance of the NPN field-effect transistor and prevents, for the most part, the small voltage present across the capacitance from being dropped across the transistor. The voltage drop of typically 300–500 mV which normally occurs at the transistor is therefore reduced The raising of the control voltage $V_{PP}$ at the control input of the transistor in order to reduce the resistance thereof is usually carried out by a charge pump which generates a control voltage $V_{PP}$ which typically even lies above the supply voltage or the external voltage $V_{EXT}$ of a memory module. Usual values for the external voltage $V_{EXT}$ at the memory module, for the internal voltage $V_{INT}$ in the memory module and for the raised control voltage $V_{PP}$ are $V_{EXT}=2.5$ V, $V_{INT}=1.8$ V and $V_{PP}=3.4$ V.

FIG. 2 shows a typical memory cell which is driven by a charge pump. The memory cell has, as in FIG. 1, a capacitance 200 for storing charges and a transistor 202 for writing charges to the capacitance 200 and for reading charges from the capacitance 200. The transistor 202 has a control input 204, at which a control voltage $V_{PP}$ can be applied in order to block or enable the writing-in or reading-out of charges.

The transistor 202 is typically a field-effect transistor having a gate terminal as control input, a source terminal as input and a drain terminal as output. The input of the transistor 202 is connected to the capacitance 200, and the output of the transistor 202 is connected to a differential amplifier 206. For the operation of the differential amplifier 206, the latter is supplied with the module-internal voltage $V_{INT}$, which is generated from the external voltage $V_{EXT}$ or supply voltage of the memory module by a generator 208. The internal voltage $V_{INT}$ is usually less than or equal to the external voltage $V_{EXT}$. The generator 208 furthermore generates a reference voltage $V_{REF}$ for the differential amplifier 206, the voltage across the capacitance 200 being compared with said reference voltage.

The line which connects the transistor 202 to the differential amplifier 206 is usually referred to as bit line (BL). The differential amplifier 206, which is also called read/write amplifier, therefore serves for identifying and amplifying a very small voltage difference on the bit line. The control input 204 of the transistor 202 is connected to a row select line 210 or a word line (WL) which drives the transistor 202. This row select line 210 assumes a logic high level whenever the corresponding row of the memory module is addressed by a row select circuit 212. If the corresponding row is not addressed, then there is a logic low level on the row select line 210. A logic high level on the row select line 210 opens the transistor 202, so that the charge stored on the capacitance 200 can alter the value on the bit line. In this case, it is important, as mentioned, that as little voltage as possible is dropped across the transistor 200. This is achieved by means of a comparatively high control voltage $V_{PP}$ at the control input 204 of the transistor 202. A good value for the control voltage $V_{PP}$ lies above the value of the external voltage $V_{EXT}$. The value of $V_{PP}$ is defined by the technology, such as e.g. the gate thickness, etc., with which a memory module is fabricated. In order to generate the high control voltage $V_{PP}$ a charge pump 214 is furthermore shown in FIG. 2, said charge pump being used to generate the control voltage $V_{PP}$ from the low external voltage $V_{EXT}$.

The charge pump 214 is connected by an input thereof to the external voltage $V_{EXT}$, while an output thereof is connected to the row select line 210, in a manner allowing disconnection by the row select circuit 212. The charge pump 214 or a $V_{PP}$ network, having the charge pump 214 supplies all the row select lines of all the memory cells which are situated in a memory module with the voltage $V_{PP}$. A $V_{PP}$ network thus comprises, in principle, all the word lines of a memory module, and the word lines comprise several thousands, of word lines, depending on the architecture and storage capacity of the memory module. All the selection transistors of the memory module are attached, in turn, to the word lines. In a 256M memory module, by way of example, 256×1 024×1 024 transistors are attached to the word lines and thus, in principle, to the $V_{PP}$ network. Of course, only a small portion of the selection transistors will ever be driven simultaneously, i.e. supplied with the control voltage $V_{PP}$ at the gale thereof. Each time a new row is activated, the voltage $V_{PP}$ is applied to a row select line WL, and the connected transistors draw current from the $V_{PP}$ network or the charge pump 214. The current at the $V_{PP}$ network behaves in a manner dependent on how often such activation of a row select line takes place per unit time. For high operating frequencies of the memory module, such activation operations take place more often per unit time, and it is evident that at a high operating frequency, a $V_{PP}$ network or the charge pump 214 must supply more power, i.e. more charge per unit time or current. A maximum current is established in the $V_{PP}$ network at the maximum operating frequency of the memory module.

FIGS. 3A and 3B show the construction and the function of a typical charge pump. The charge pump is connected to the external voltage $V_{EXT}$ and supplies, at its output, the control voltage $V_{PP}$ for example for the transistor 202 in FIG. 2. The charge pump has a first capacitance 316 and a second capacitance 318 and a first group of switches 320, 322 and a second group of switches 324, 326, 327.

FIG. 3A shows a charging operation of the charge pump or of the capacitances 316 and 318. During the charging operation, the capacitances are connected in parallel with one another by the closing of the switches 324, 326, 327 and by the opening of the switches 320, 322 and are charged with the external voltage $V_{EXT}$ in parallel with one another. By contrast, FIG. 3B shows a discharging operation, during which the charge pump outputs the charge taken up and supplies the generated control voltage $V_{PP}$ to a transistor. During the discharging operation, the capacitances 316 and 318 are connected in series with one another by the opening of the switches 324, 326, 327 and by the closing of the switches 320, 322, in order to supply a voltage which is greater than the external voltage $V_{EXT}$.

The charging operation and the discharging operation are carried out periodically until the desired voltage level of the control voltage $V_{PP}$ is established, the charge pump then being deactivated. If the value of the control voltage $V_{PP}$ falls below a specific value, then the charge pump is activated again on the basis of a threshold comparison. The time interval between two charging operations is determined by a clock. This clock must be chosen optimally. On the one hand, the clock must be as high as possible in order that the $V_{PP}$ network is charged as rapidly as possible and, during charge flow, the $V_{PP}$ network is held at the desired voltage level thereof; on the other hand, a specific maximum frequency of the clock must not be exceeded, in order that the charge pump can still function properly.

FIG. 4 shows a charge pump 414 and the typical construction of a drive arrangement for the charge pump 414. The charge pump 414 is supplied with the external voltage $V_{EXT}$ and supplies the control voltage $V_{PP}$ at its output. The drive arrangement 414 of the charge pump has an oscillator 426, which feeds to the charge pump 414 a charging control frequency $f_{CC}$ 430 or a clock which temporally controls the charging of the charge pump 414, such as e.g. the capacitances in FIG. 3. The oscillator 428 is a circuit element which is additionally provided in a memory module and which generates a defined charging control frequency which cannot be varied. This charging control frequency is typically fixed at a frequency which precisely enables the charge pump to generate, at the maximum operating frequency of a memory module or chip, a sufficient charge or stable control voltage $V_{PP}$ for all of the driven memory cells in the memory module. Therefore, the oscillator 428 is designed precisely for this maximum operating frequency in terms of circuitry.

The drive arrangement for the charge pump 414 furthermore has a regulator 432, which activates the charging of the charge pump if the control voltage $V_{PP}$ of a transistor of a memory cell or the control voltage $V_{PP}$ of the transistors of memory cells of a memory module falls below a specific reference voltage $V_{REF}$. To that end, the regulator 432 has an input for the control voltage $V_{PP}$ and an input for the reference voltage $V_{REF}$. The charge pump 414 and the charging of the charge pump 414 are typically controlled by means of an on/off signal 434, which can activate and deactivate both the charge pump 414 and the oscillator 428.

FIG. 5 shows the power of a charge pump from FIG. 3 as a function of the charging control frequency $f_{CC}$ of an oscillator, such as e.g. the oscillator 428 in FIG. 4, which temporally controls the charge pump. The curve of the power P shows that the power P is higher, the higher the frequency $f_{CC}$. However, starting from a specific maximum charging control frequency $f_{MAX}$, the power of the charge pump dips, which, with reference to FIG. 3, is determined on the one hand by temporal superposition of charging that is still being carried out and the capacitances already being connected in parallel, and on the other hand by excessively short periods of time available for the charging operation and the discharging operation. This point of the maximum frequency fad can be determined by simulation of the entire $V_{PP}$ pump. The oscillator is designed in such a way that it supplies an oscillator frequency or charging control frequency which lies just before the truncation of the power P of the charge pump and is assigned to the maximum operating frequency $f_{CLK}$ of the memory module and the power demand or the control voltage demand of the memory cells at this maximum operating frequency $f_{CLK}$. The charging control frequency $f_{CC}$ supplied is lower than the maximum charging control frequency $f_{MAX}$, in order that the maximum charging control frequency $f_{MAX}$ is not exceeded in the event of frequency fluctuations as a result of the technology, the temperature and as a result of supply voltage fluctuations. The oscillator can only supply this defined charging control frequency, irrespective of the operating frequency with, which a memory module is actually operated.

One disadvantage of a drive arrangement for a charge pump as is shown in FIG. 4 therefore consists in the fact that the oscillator 428 drives the charge pump 414 with a defined charging control frequency which is assigned to a maximum operating frequency of a memory module in order to supply sufficient voltage at this maximum operating frequency. Thus, at lower operating frequencies or varying lower operating frequencies of the memory module, the charge pump 414 generates too much charge and the entire circuit therefore consumes too much current in these cases.

U.S. Pat. No. 6,584,032 to Fujioka et al. discloses an internal voltage generator. The internal voltage generator generates an internal voltage to be supplied to an internal circuit. A predetermined amount of power is needed for operating the internal voltage generator. The internal voltage generator can be inactivated by an entry circuit, which is controlled by a control signal from the exterior. The power consumption can be reduced. Depending on the control signal from the exterior, a chip can enter a low power consumption mode.

U.S. Pat. No. 6,396,324 to Hsu et al. discloses a clock system, which is able to use an external system clock for driving a charge circuit of a semiconductor memory unit for restoring and refreshing a data area of the memory unit. The clock system comprises a plurality of control circuits, an internal clock generator circuit and a multiplexer. The multiplexer outputs either the external system clock or the internal system clock to a charge circuit according to a control signal, which is transmitted by a central processing unit to the clock system.

A further disadvantage is that chip area is taken up by the oscillator which is to be additionally accommodated in the memory module and is provided for the temporal control of the charge pump.

SUMMARY OF THE INVENTION

The object of the present invention is to provide a device for driving a memory cell of a memory module and a memory module which enable more energy-efficient and simplified memory modules.

This object is achieved by means of a device for driving a memory cell of a memory module in accordance with Claim 1 and a memory module in accordance with Claim 7.

One advantage of the device and the memory module of the present invention is that they enable the operation of a charge pump at an optimal operating point.

A further advantage is that the power of a charge pump is determined by the operating frequency of the memory module, and the current consumption of the charge pump is automatically controlled with the respective operating frequency chosen for the memory module and is thus reduced in comparison with the prior art.

A further advantage is that chip area is saved by the charge pump construction according to the invention.

Advantageous developments and improvements of the device specified in Claim 1 and of the memory module specified in Claim 7 are found in the subclaims.

In accordance with one preferred development of the device of the present invention, the charging control frequency corresponds to the operating frequency.

In accordance with a further preferred development of the device of the present invention, the device has a frequency divider, which generates the charging control frequency from the operating frequency by frequency division.

In accordance with a further preferred development of the device of the present invention, the device furthermore has a regulator, which activates the charging of the charge score if the control voltage falls below a specific reference value.

In accordance with a further preferred development of the device of the present invention, the charge store has at least two capacitances which are controlled by the charging control frequency in such a way that, during a first section of a clock cycle of the charging control frequency, they are connected in parallel with one another in order to be charged with the external voltage and, during a second section of a clock cycle of the charging control frequency, they are connected in series with one another in order to generate the control voltage.

In accordance with a further preferred development of the device of the present invention, the transistor has a field-effect transistor with a gate terminal at which the control voltage is present.

In accordance with a preferred development of the memory module according to the present invention, the memory module has a memory module from a group having a dynamic random access memory (DRAM), a synchronous data random access memory (SDRAM), an enhanced data out random, access memory (EDORAM) and a double data rate synchronous graphics random access memory (DDR SGRAM).

Preferred exemplary embodiments of the present invention are explained in more detail below with reference to the accompanying drawings, in which:

BRIEF DESCRIPTION OF THE DRAWINGS

FIG. 7 shows the power of a charge pump in a device according to FIG. 6.

DETAILED DESCRIPTION OF THE INVENTION

Figure 6:
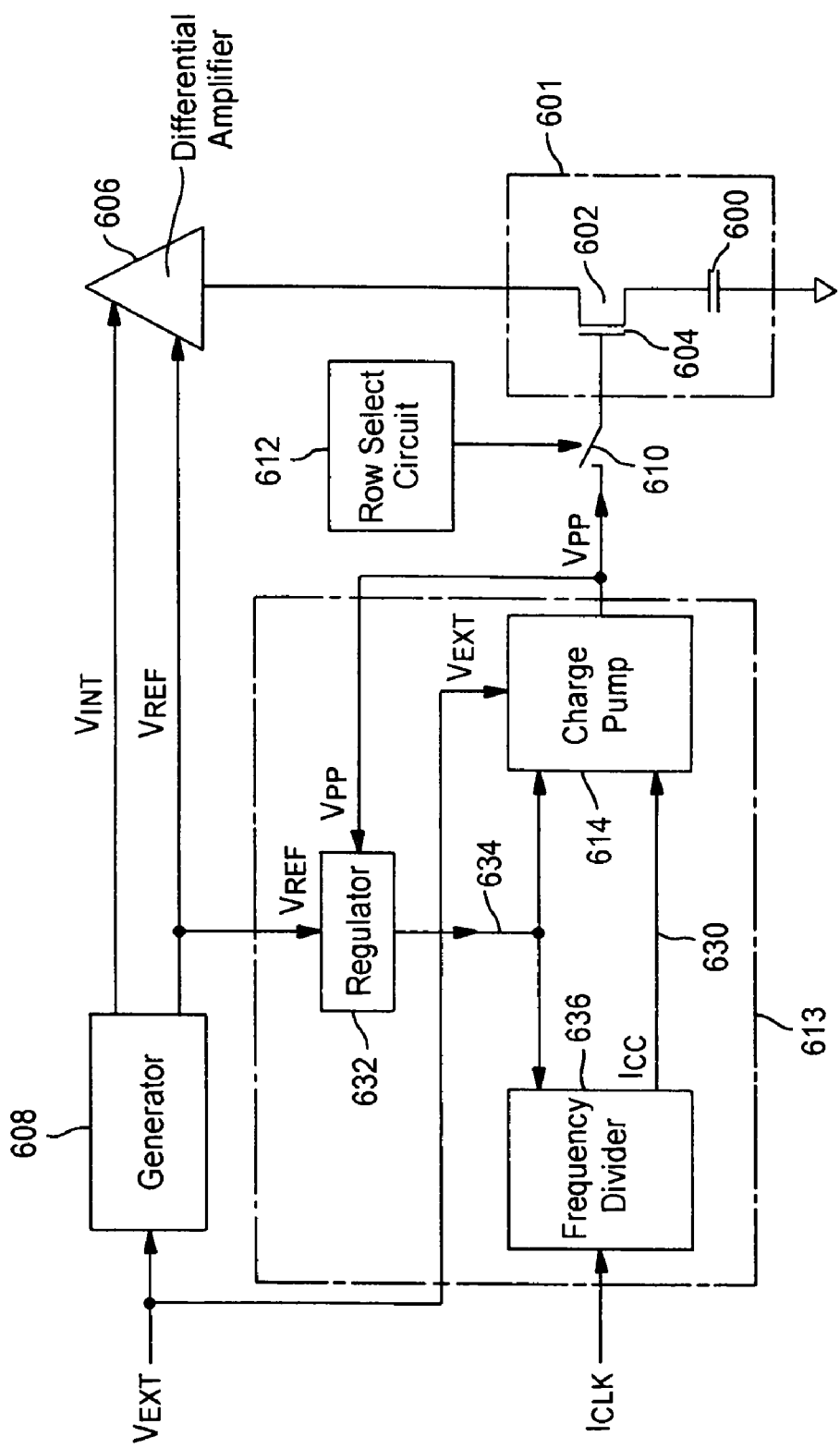
FIG. 6 shows a preferred exemplary embodiment of a device for driving a memory cell according to the present invention.

FIG. 6 shows an exemplary embodiment of a device for driving a memory cell of a memory module according to the present invention. The memory module preferably has a memory module which is selected from a group having a dynamic random access memory (DRAM), a synchronous data random access memory (SDRAM), an enhanced data out random access memory (EDORAM) and a double data rate synchronous graphics random access memory (DDR SGRAM; DDR SGRAM=Double Data Rate Synchronous Graphics Dynamic [sic] Access Memory). However, the memory module may also have other customary memory modules with the memory cells described.

FIG. 6 firstly shows a memory cell 601 having a capacitance 600 for storing charges and a transistor 602 for writing charges to the capacitance 600 and for reading charges from the capacitance 600. The transistor 602 has a control input 604, at which a control voltage $V_{PP}$ ran be applied in order to block or enable the writing-in or reading-out of charges. The transistor 602 is preferably a field-effect transistor having a gate terminal as control input 604, a source terminal as input and a drain terminal as output. The input of the transistor 602 is connected to the capacitance 600, and the output of the transistor 602 is connected to a differential amplifier 606. For the operation of the differential amplifier 606, the latter is supplied with the module-internal voltage $V_{INT}$ and with a reference voltage $V_{REF}$, with which the voltage across the capacitance 600 is compared, $V_{INT}$ and $V_{REF}$ being generated from the external voltage $V_{EXT}$ or supply voltage of the memory module by a generator 608.

The control input 604 of the transistor 602 is connected to a row select line 610, which drives the transistor 602. This row select line 610 assumes a logic high level for opening the transistor 602 whenever the corresponding row of the memory module is addressed by a row select circuit 612. If the corresponding row is not addressed, then there is a logic low level on the row select line 610.

A device 613 for driving the memory cell 601 has a charge store 614, preferably a charge pump 614, which generates the high control voltage $V_{PP}$ from the low external voltage $V_{EXT}$. The charge pump 614 is connected by an input thereof to the external voltage $V_{EXT}$, while an output thereof is connected to the row select line 610, in a manner allowing disconnection by the row select circuit 612. The charging of the charge pump 614 is controlled by a charging control frequency $f_{CC}$ 630 which, in contrast to the prior art, is not generated by an oscillator, but rather is derived from the operating frequency or clock frequency $f_{CLK}$ of the memory module.

In the preferred exemplary embodiment of the present invention as shown in FIG. 6, the devise 613 for driving a memory cell of a memory module furthermore has a frequency divider 636, which is arranged upstream of the charge pump 614 and generates the charging control frequency $f_{CC}$ 630 from the operating frequency $f_{CLK}$ of the memory module by frequency division. The device 613 for driving a memory cell furthermore has a regulator 632, which activates the charging of the charge pump 614 if the control voltage $V_{PP}$ of the transistor 602 of the memory cell 601 falls below a specific reference value $V_{REF}$. To that end, the regulator 632 comprises an input at which the control voltage $V_{PP}$ is present, and a further input at which the reference voltage $V_{REF}$ is present, which is supplied by the generator 608. The charging of the charge pump 614 is then controlled by the regulator 632 preferably by means of an on/off signal 634, which can activate and deactivate the charge pump 614. The regulator 632 preferably has a comparator which compares the control voltage $V_{PP}$ with the reference voltage $V_{REF}$ and generates the on/off signal 634 therefrom.

In the preferred exemplary embodiment shown in FIG. 6, the frequency divider 636 is also activated or deactivated by the on/off signal 634 of the regulator 632. In an alternative variant (not shown) of this exemplary embodiment, the frequency divider 636 is operated continually.

In a further exemplary embodiment of the device for driving a memory cell according to the present invention, the charge pump 614 is driven directly by the operating frequency of the memory module and a frequency divider 636 as in FIG. 6 is not provided.

Figure 1:
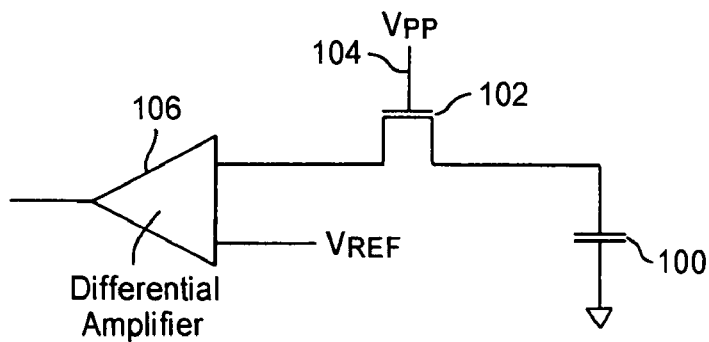
FIG. 1 shows a typical memory cell of a memory module.
Figure 2:
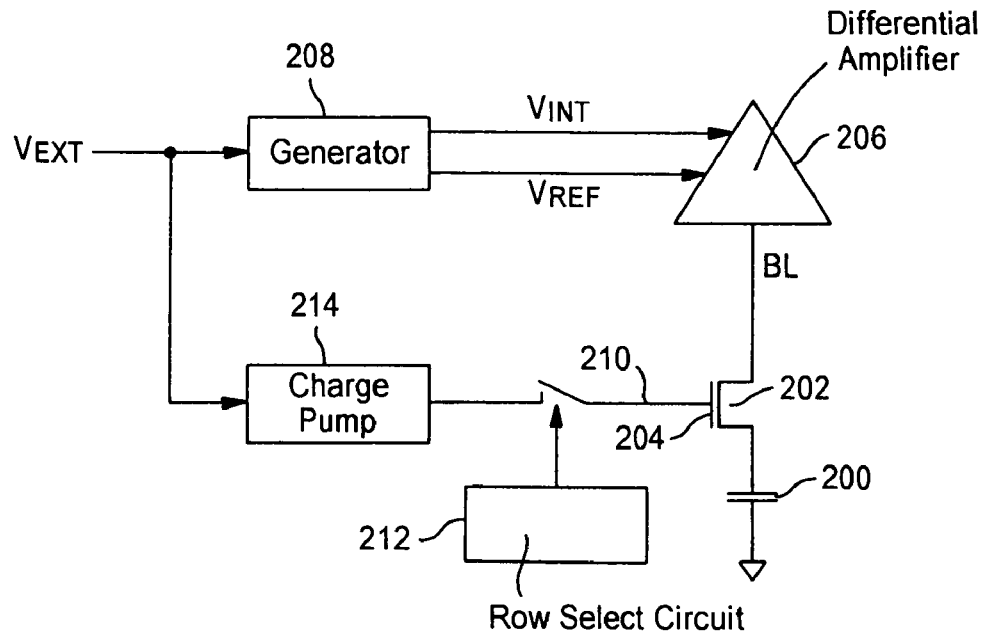
FIG. 2 shows a typical memory cell which is driven by a charge pump.
Figure 3A:
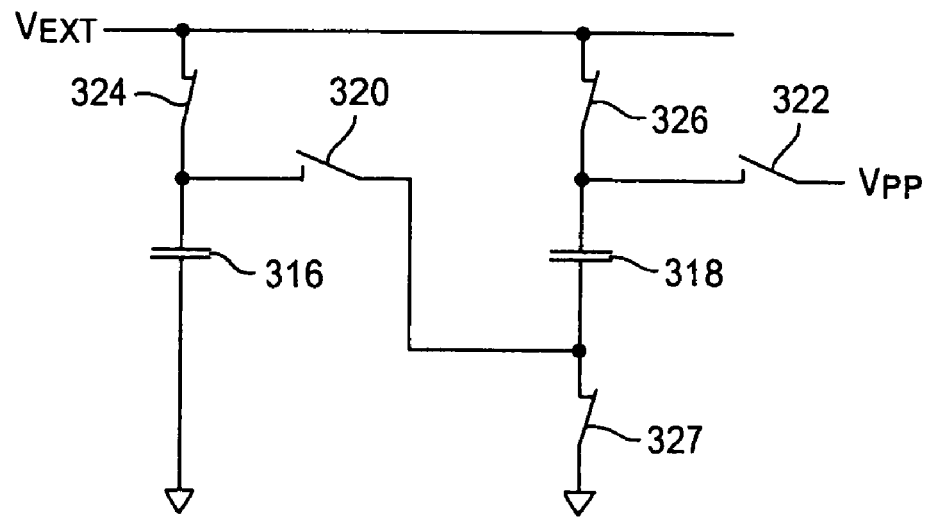
FIGS. 3A and 3B show the construction and the function of a typical charge pump.
Figure 3B:
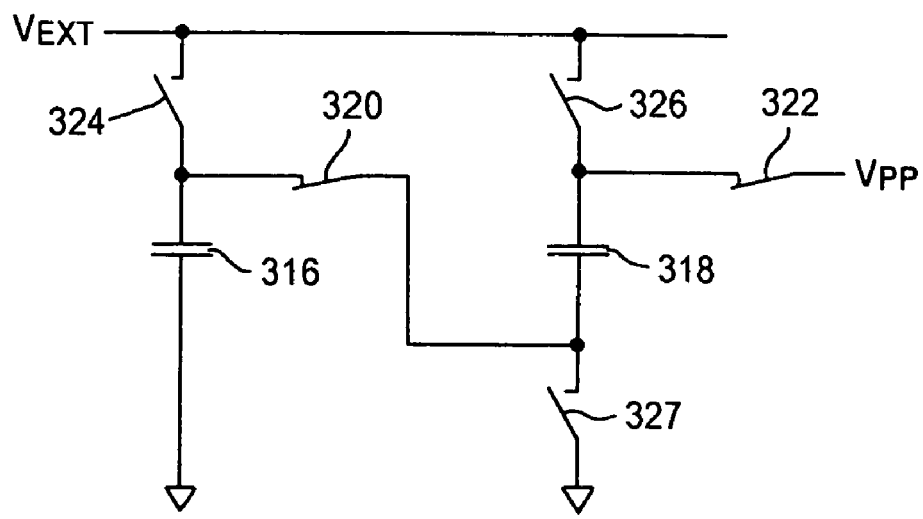
Figure 4:
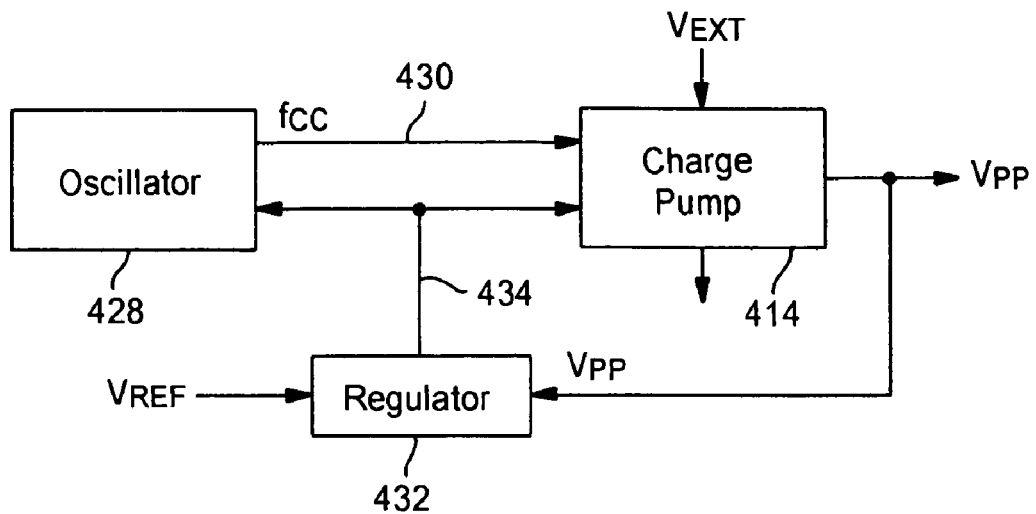
FIG. 4 shows a charge pump and the typical construction of a drive arrangement for a charge pump.
Figure 5:
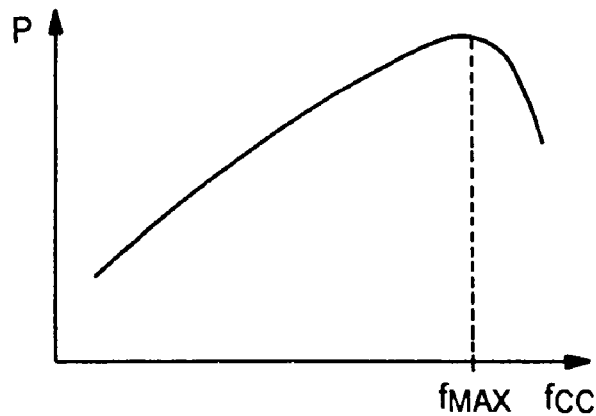
FIG. 5 shows the power of a charge pump from FIG. 3 as a function of a charging control frequency.

FIG. 7 shows the power of a charge pump in a device 613 for driving a memory cell according to FIG. 6 as a function of the operating frequency $f_{CLK}$ of a memory module. A memory module cat usually be operated in a frequency range between a minimum operating frequency $f_{MIN}$ and a maximum operating frequency $f_{MAX}$. As mentioned with respect to FIG. 4, in the prior art, an oscillator 428 for operating a charge pump therefore supplies a defined frequency which is assigned or corresponds to the maximum operating frequency $f_{MAX}$ in order to ensure that at the maximum operating frequency, which also corresponds to an elevated number of accesses to the memory cells, a sufficient control voltage $V_{PP}$ is supplied for all the memory cells of a memory module. In the case of the present invention, however, the oscillator 428 of FIG. 4 is dispensed with, and the charging control frequency $f_{CC}$ of the charge pump 614 is derived from the operating frequency $f_{CLK}$ of the memory module either directly, so that it corresponds to the operating frequency $f_{CLK}$, or by frequency division, so that it is proportional to the operating frequency $f_{CLK}$. Through direct control of the charge pump 614 by means of the operating frequency $f_{CLK}$ or through indirect control of the charge pump 614 by means of a frequency-divided operating frequency $f_{CLK}$, the power of the charge pump is proportional to the operating frequency $f_{CLK}$. This has the result that, as is shown in FIG. 7, the supplied power P and thus the power consumption of the charge pump 614 is coupled to the operating frequency $f_{CLK}$, and the actual line [sic] demand and follows the operating frequency $f_{CLK}$ between the minimum operating frequency $f_{MIN}$ and the maximum operating frequency $f_{MAX}$ and therefore enables a need-conforming and energy-efficient operation of the charge pump 614 and therefore of the memory module at every operating frequency 702 between the minimum operating frequency $f_{MIN}$ and the maximum operating frequency $f_{MAX}$.

One advantage of the present invention therefore consists in the fact that the charging control frequency of the charge pump is derived from the operating frequency of the memory module and it is thereby guaranteed that the charge pump always supplies exactly the correct amount of charge and the external current consumption of the memory module is thereby optimized.

A further advantage is that the customary oscillator can be replaced by a simple frequency divider circuit, which takes up less chip area.

The invention claimed is:

1. Device for driving a memory cell of a memory module which can be operated with an external voltage and an operating frequency, the memory cell having a capacitance for storing charges and a transistor for reading charges from the capacitance and for writing charges to the capacitance, which transistor can be controlled with a control voltage, having a charge store for supplying the control voltage which is greater than the external voltage, the charge store being able to be charged by the external voltage, and the charging of the charge store being able to be controlled temporally by a charging control frequency derived from a clock frequency of the memory module either directly, so that the charging control frequency corresponds to the clock frequency, or by frequency division, so that the charging control frequency is proportional to the clock frequency, so that the power consumption of the charge store is coupled to the clock frequency and the actual demand and follows the clock frequency and enables a need-conforming and energy-efficient operation of the charge store and of the memory module.

2. Device according to claim 1, wherein the charging control frequency corresponds to the operating frequency.

3. Device according to claim 1, which furthermore has a frequency divider, which generates the charging control frequency from the operating frequency by frequency division.

4. Device according to claim 1, which furthermore has a regulator, which activates the charging of the charge store if the control voltage falls below a specific reference value.

5. Device according to claim 1, wherein the transistor has a field-effect transistor with a gate terminal at which the control voltage is present.

6. Memory module having at least one memory cell, each memory cell having a device for driving a memory cell in accordance with claim 1.

7. Memory module according to claim 6, which has a memory module from a group having a dynamic random access memory (DRAM), a synchronous data random access memory (SDRAM), an enhanced data out random access memory (EDORAM) and a double data rate synchronous graphics random access memory (DDR SGRAM).

8. Device according to claim 1, wherein the charge store has at least two capacitances which are controlled by the charging control frequency in such a way that, during a first section of a clock cycle of the charging control frequency, they are connected in parallel with one another in order to be charged with the external voltage and, during a second section of a clock cycle of the charging control frequency, they are connected in series with one another in order to generate the control voltage.

* * * * *